US008174876B2

(12) United States Patent
Lee (10) Patent No.: US 8,174,876 B2
(45) Date of Patent: May 8, 2012

(54) FUSION MEMORY DEVICE EMBODIED WITH PHASE CHANGE MEMORY DEVICES HAVING DIFFERENT RESISTANCE DISTRIBUTIONS AND DATA PROCESSING SYSTEM USING THE SAME

(75) Inventor: Se Ho Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 135 days.

(21) Appl. No.: 12/647,604

(22) Filed: Dec. 28, 2009

(65) Prior Publication Data

US 2010/0321989 A1    Dec. 23, 2010

(30) Foreign Application Priority Data

Jun. 19, 2009  (KR) .................. 10-2009-0054891
Aug. 3, 2009   (KR) .................. 10-2009-0071244

(51) Int. Cl.
*G11C 11/00* (2006.01)

(52) U.S. Cl. ........................ 365/163; 365/148

(58) Field of Classification Search .......... 365/163, 365/148
See application file for complete search history.

(56) References Cited

U.S. PATENT DOCUMENTS

| 7,453,716 | B2* | 11/2008 | Kim et al. | 365/148 |
| 7,893,420 | B2* | 2/2011 | Liang et al. | 257/4 |
| 2005/0047248 | A1* | 3/2005 | Kim et al. | 365/222 |
| 2006/0059405 | A1* | 3/2006 | Parkinson | 714/763 |
| 2009/0010047 | A1* | 1/2009 | Sheu et al. | 365/163 |
| 2010/0015755 | A1* | 1/2010 | Matsui et al. | 438/95 |

FOREIGN PATENT DOCUMENTS

| KR | 100810615 B1 | 2/2008 |
| KR | 1020080049772 A | 6/2008 |

* cited by examiner

*Primary Examiner* — Michael Tran
(74) *Attorney, Agent, or Firm* — Ladas & Parry LLP (57) ABSTRACT

A fusion memory device having phase change memory devices that have different resistance distributions and a corresponding data processing system is presented. The fusion memory device includes a first and a second phase change memory group arranged on the same chip. Because the second phase change memory group exhibits a resistance distribution different from that of the first phase change memory group, then the fusion memory device can be configured to simultaneously function as both a DRAM device and as a flash memory device. Because the first and second phase change memory groups can be composed of similar PRAM components, the corresponding manufacturing and driving circuitry is markedly simplified as compared to other fusion memory devices that have dissimilar DRAM and flash memory components.

20 Claims, 6 Drawing Sheets

FUSION MEMORY DEVICE EMBODIED WITH PHASE CHANGE MEMORY DEVICES HAVING DIFFERENT RESISTANCE DISTRIBUTIONS AND DATA PROCESSING SYSTEM USING THE SAME

CROSS-REFERENCES TO RELATED APPLICATION

The present application claims priority under 35 U.S.C. 119(a) to Korean application numbers 10-2009-0054891 and 10-2009-0071244, filed on Jun. 19, 2009 and Aug. 3, 2009, respectively, in the Korean Patent Office, which are incorporated by reference in its entirety as if set forth in full.

BACKGROUND OF THE INVENTION

1. Technical Field

The embodiments described herein relate to semiconductor integrated devices and, more particularly, to a fusion memory device composed of memory devices that exhibit different functions and a data processing system using the same.

2. Related Art

Memory device can be classified into a volatile memory devices and a non-volatile memory devices. The volatile memory devices include random access memories (RAM) which data stored therein are erased when the power is off. Non-volatile memory devices include read only memories (ROM) which data stored therein is retained when power is off. Typically, a dynamic random access memory (DRAM) is regarded as the RAM and a flash memory device is regarded as the ROM.

DRAMs operate at relatively high speeds due to lower power consumption and simple random access. However, DRAMs require carrying out periodic refresh operations due to their volatile properties and require an increased capacitor capacity due to demand for high charge storage.

Meanwhile, flash memory devices readily stores data at high capacities due to a relatively high integration and flash memories do not require refresh operations due to their non-volatile properties. However, flash memories requires operation voltages that a relatively higher than the power voltage due to the two-layered stack gate structure. Accordingly, flash memories oftentimes require separate voltage boosting circuits for generating the desired program and erase voltages. Furthermore, since it is difficult to randomly access, data is programmed at a page unit, and thereby operating speeds of flash memories are often relatively slow.

Currently, due to market demands, semiconductor memory devices are gradually scaled down more and more. It is a market trend to embody a system on chip (SOC) that the functional blocks having various functions are integrated on one-chip. A fusion memory device is an exemplary SOC.

The fusion memory device is a compound memory device that may contain various different types of memory devices such as having memory chips that have different properties or have non-memory chips which are embedded into a basic memory device together with logic devices. That is, the fusion memory is regarded as a system memory that also provides software suitable to the system specification. A fusion memory device composed of a flash memory device and a static RAM (SRAM) together with a logic device may be integrated into a one-chip design depending on how complex and how high performance the digital electronic appliances needs.

Therefore, flash memory device may require a DRAM which is a representative volatile memory device and a flash memory device which is a non-volatile memory device to be integrated in one-chip. However, the DRAM and the flash memory device have distinctly different operation voltages and different driving operational modes such that the different driving circuits are required. Furthermore, since they have different device structures, when they are integrated on one semiconductor substrate, they necessarily must be fabricated by using separately distinct fabrication processes.

SUMMARY

A fusion memory device includes a first phase change memory group, and a second phase change memory group arranged on the same chip with the first phase change memory group and having a resistance distribution different from the first phase change memory group during phase-changing.

The first phase change memory device group may be a substitute device for a flash memory device and the second phase change memory device group may be a substitute device for a DRAM device.

The first phase change memory group may have a first sensing ratio and the second phase change memory group may be a second sensing ratio lower than the first sensing ratio.

The first phase change memory group may comprise a plurality of phase change memory cells which are programmed such that a phase change material layer in each of the plurality of phase change memory cells is fully phase-changed. The second phase change memory group may comprise a plurality of phase change memory cells which are programmed such that a phase change material layer in each of the plurality of phase change memory cells is partially phase-changed.

The plurality of phase change memory cells in the second phase change memory group may be smaller than the plurality of phase change memory cells in the first phase change memory group.

According another example embodiment comprises a fusion memory device that includes a first phase change memory group composed of a plurality of first phase change memory cells, each has a first set resistance and a first reset resistance and a second phase change memory group configured to be integrated on the same substrate with the first phase change memory group and being composed of a plurality of second phase change memory cells, each having a second set resistance and a second reset resistance, wherein the second reset resistance is smaller than the first reset resistance.

According to still another example embodiment, a data processing system includes a central processing unit (CPU), a data storage block configured to be controlled by the CPU and including memory cell arrays and a page buffer, and a work memory block configured to be controlled by the CPU and performing an address mapping operation of the data storage block. The data storage block comprises a first phase change memory group having a first set resistance and a first reset resistance. The work memory block comprises of a second phase change memory group having a second set resistance and a second reset resistance. The second reset resistance is lower than that of the first reset resistance.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements.

The inventive concept can embody phase change memory devices having various performances by modifying resistance distributions of the phase memory devices such that a DRAM and a flash memory device in a fusion memory device are substituted with phase change memory devices. Hereinafter, the fusion memory device with complex function will be described in more detail. In an example embodiment, the word "fusion memory" is commonly designated as a memory device that a main memory as well as a different kind of memory such as non-memories or specific logic devices are integrated on one-chip.

Figure 1:
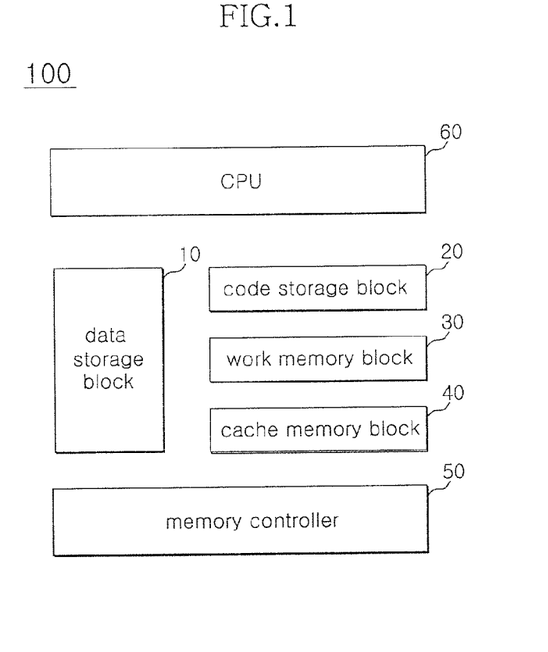
FIG. 1 is a block diagram illustrating a data processing system as an example of a fusion memory device according to the inventive concept.

FIG. 1 is a data processing system 100 as an example of a fusion memory device according to an example embodiment. Referring to FIG. 1, the data processing system 100 may include a data storage block 10, a code storage block 20, a work memory block 30, a cache memory block 40, a memory controller 50 and a central processing unit (CPU) 60.

In the data processing system 100, when the data desired by the CPU 60 does not exist in the work memory block 30, the CPU 60 provides commands and addresses to the memory controller 50. The memory controller 50 subsequently writes the commands and the addresses into the data storage block 10 by using the predetermined interface method. When the commands and the addresses are provided, the data storage block 10 automatically carries out the read/write operation. Furthermore, the page data read from a memory core (not shown) of the data storage block 10 is temporarily stored in a page buffer (not shown) within the data storage block 10. The page data stored in the page buffer is transferred to the work memory block 30 by a constant unit. If a desired amount of data is transferred to the work memory block 30, then the CPU 60 receives the data transferred in the work memory block 30.

Herein, the data storage block 10 may include a plurality of memory cell arrays and the page buffer and the data storage block 10 may comprise a memory device with high data processing speed and a long life span. The work memory block 30 controls the address mapping operation of the data storage block 10 and may comprise a memory device with a simple random access and a lower power consumption. The cache memory 40 makes a demand for higher operation speed and may comprise an SRAM with fast operation speed.

Currently, the data storage block 10 mainly comprises a NAND flash memory device with a large capacity and the work memory device 30 main comprises a DRAM with an excellent random access. However, if different kinds of memory devices are integrated per the block as above, problems can occur with regards to the driving circuit and fabrication aspects. Therefore, in the following example embodiment, only one device is constructed to carry out different functions.

That is, in this example embodiment, phase change memory devices having different phase change properties (hereinafter "phase change memory groups") are disposed by a block such that the data processing speed and the power consumption can be compensated and the non-volatile property (That is, the data retention property) can be sustained. Also, the phase change property can be regarded as the resistance property in phase-change. The different phase change properties mean that the resistance distribution in a set state is different from the resistance distribution in a reset state.

Figure 2:
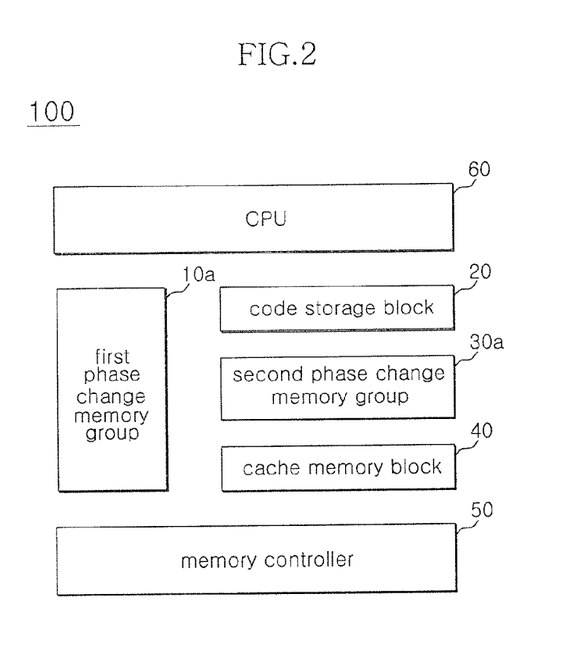
FIG. 2 is a block diagram illustrating a data processing system according to an example embodiment.

For example, in this example embodiment, as shown in FIG. 2, a first phase change memory group 10a having a first phase change property as well as a flash memory device property is disposed as the data storage block 10 in the data processing system 100. A second phase change memory group 30a having a second phase change property and a DRAM device property is disposed as the work memory block 30. The first phase change property is different from the second phase change property.

Figure 3:
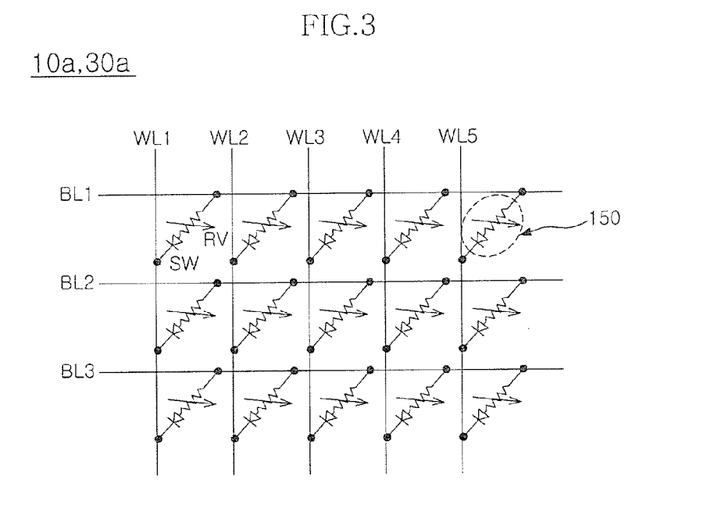
FIG. 3 is a schematic circuit diagram of first and second phase change memory groups according to the example embodiment.

Referring to FIG. 3, each of the first and second phase change memory groups 10a and 30a comprises an array of phase change memory cells 150, each phase change memory cell comprises a variable resistor Rv and a switching device SW. The variable resistor Rv may comprise a phase change material layer (not shown) in which a resistance thereof is varied by a current and the switching device SW may be composed of a diode. All the memory cells constituting the first and second phase change memory groups 10a and 30a may be configured to have substantially the same size and substantially the same structure.

In the example embodiment, first and second data sensing ratios of the first and second phase change memory groups 10a and 30a are modified such that the first and second phase change memory groups 10a and 130a have different phase change properties (That is, the phase change resistance distributions) each other.

Figure 4:
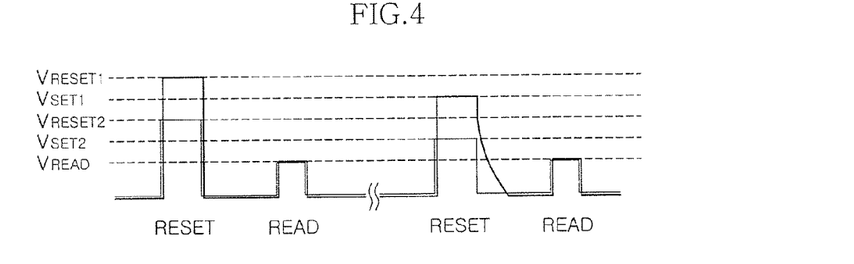
FIG. 4 is a diagram showing voltage program conditions of the first and second phase change memory groups according to the example embodiment.

That is, in order for the first phase change memory group 10a to have a relatively higher sensing ratio, a first reset voltage $V_{RESET1}$ and a first set voltage $V_{SET1}$ are applied thereto such that the data of "1(RESET1)" and "0(SET1)" are written in the variable resistors Rv, respectively. A first read voltage $V_{READ}$ having a lower magnitude than that of the first reset voltage $V_{RESET1}$ and that of the first set voltage $V_{SET1}$ is applied to the first phase change memory group 10a such that the data written in the variable resistors Rv are read. Herein, the first reset and set voltages ($V_{RESET1}$, $V_{SET1}$) may be pulsed between about 10 to 500 ns so as to drive the variable resistors Rv to be sufficiently phase-changed. Preferably, the first set and reset voltages ($V_{SET1}$, $V_{RESET1}$) may be pulsed between about 100 to 300 ns.

Meanwhile, in order for the second phase change memory group 30a to have a relatively lower sensing ratio than that of the first phase change memory group 10a, a second reset voltage $V_{RESET2}$ and the second set voltage $V_{SET2}$ are applied thereto such that the data of "1(RESET2)" and "0(SET2)" are written in the variable resistors Rv. The second reset voltage $V_{RESET2}$ and the second set voltage $V_{SET2}$ are lower than the first reset voltage $V_{RESET1}$ and the first set voltage $V_{SET}$, respectively. A second read voltage $V_{READ}$ has a voltage magnitude which is lower than the second reset and set voltages ($V_{RESET2}$, $V_{SET2}$) is applied to the second phase change memory group 30a such that the data written in the variable resistors Rv are read. At this time, the first and second read voltages $V_{READ}$ may have the values which are not affected to the phase change operation of the variable resistor RV and may be identical each other.

Figure 5:
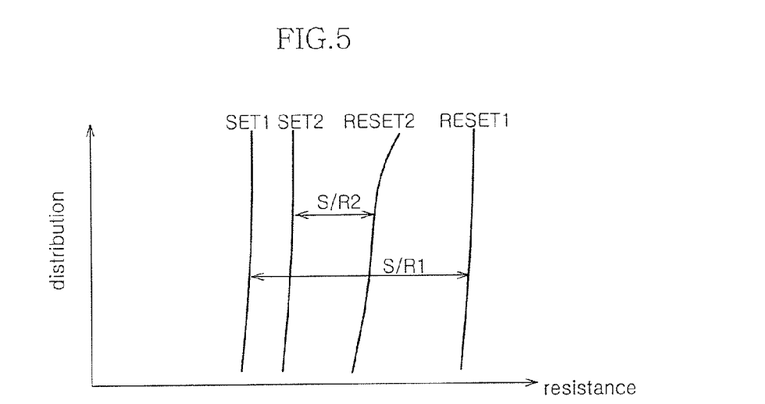
FIG. 5 is a graph showing resistance distributions of the first and second memory groups according to the example embodiment.

As compared with the second phase change memory group 30a, since the first reset and set voltages ($V_{RESET1}$, $V_{SET1}$) are set to have relatively higher voltage levels are applied to the first phase change memory group 10a as a result the first phase change memory group 10a has a high sensing ratio. That is, the phase change material corresponding to each of the variable resistors Rv in the first phase change memory group 10a transforms more completely between amorphous or crystalline states. Therefore, as shown in FIG. 5, the S/R1 ratio, as defined by the ratio of resistance distributions corresponding to the first set SET1 and the first reset RESET1, is relatively increased as compared to the S/R2 ratio. According the first phase change memory group 10a exhibits a relative inherent non-volatile property as well as it ensures for sufficient capacity and is capable of random access. As a result, the program and erase procedures at a block unit level, as employed in the prior art, are unnecessary. Therefore, the data processing speeds and the life span can be improved.

Meanwhile, relative to the first phase change memory group 10a, the data written in the second phase change memory group 30a uses lower magnitude voltages. That is, the magnitudes of second reset and set voltages ($V_{RESET2}$, $V_{SET2}$) are lower than the first reset and set voltages ($V_{RESET1}$, $V_{SET1}$) respectively. As a result, the phase change material layer in each of the variable resistors Rv in the second phase change memory group 30a only transitions partially between the amorphous and crystalline states as compared to the more complete phase transitions in the first phase change memory group 10a. According to this, as shown in FIG. 5, the resistances of the second set SET2 and the second reset RESET2 are distributed between the first set SET1 and the first reset and RESET1. As a result the second sensing ratio S/R2, i.e., the ratio of the resistance distributions between the second set SET2 and the second reset RESET2 is smaller than the first sensing ratio S/R1. As a result, a relative ratio of the first sensing ratio S/R1 to the second sensing ratio S/R2 may be about several tens through several hundreds.

Although the second sensing ratio S/R2 is smaller than the first sensing ratio S/R1, the second phase change memory group 30a has a distinct resistance distribution between the second set SET2 and the second reset RESET2 such that it can be used to normally perform memory operations that store the data therein.

As compared with the first phase change memory group 10a, the power consumption in the second phase change memory group 30a can be considerably reduced by applying the relatively lower second reset and set voltages $V_{RESET2}$ and $V_{SET2}$ and the fast operation speeds can be ensured by partially transitioning phase-change operations the second phase change memory group 30a. Furthermore, since the second phase change memory group 30a also exhibits an inherent non-volatile property, in that it does not require either a refresh operation and a separate circuit which means it can ensure data integrity at the sufficiently extended retention times.

At this time, the first reset voltage $V_{RESET1}$ can be varied depending on the size and integration degree of the phase change memory device. For example, the first reset voltage $V_{RESET1}$ may be varied between about 1 to 3V. The magnitude of second reset voltage $V_{RESET2}$ may be lower than the first reset voltage $V_{RESET1}$ and for example, the magnitude of second reset voltage $V_{RESET2}$ may be between about 0.1 to 1V. The magnitude of the first set voltage $V_{SET1}$ may be slightly lower than that of the first reset voltage $V_{RESET1}$. Likewise, the magnitude of the second set voltage $V_{SET2}$ may be slightly lower than that of the second reset voltage $V_{RESET2}$. Although the first set status SET1 and the second set status SET2 which are different are illustrated herein, it is understood that ultimately the resistance distribution of the first status SET1 may be almost similar to that the resistance distribution of the second set status SET2 depending on the relative differences of the respective set voltages.

According to this example embodiment, the sensing ratios are controlled relative to the change of the phase change resistance distributions in the phase change memory groups such that the phase change memory groups performs the flash memory and the DRAM functions respectively. Accordingly, one memory device can perform various functions.

If the phase change memory devices are substituted for the DRAM device and the flash memory device, the problem for the data processing speed in the flash memory device can be compensated as well as the problem for power consumption and data retention in the DRAM can be compensated, such that the function of the fusion memory device can be further improved.

Figure 6:
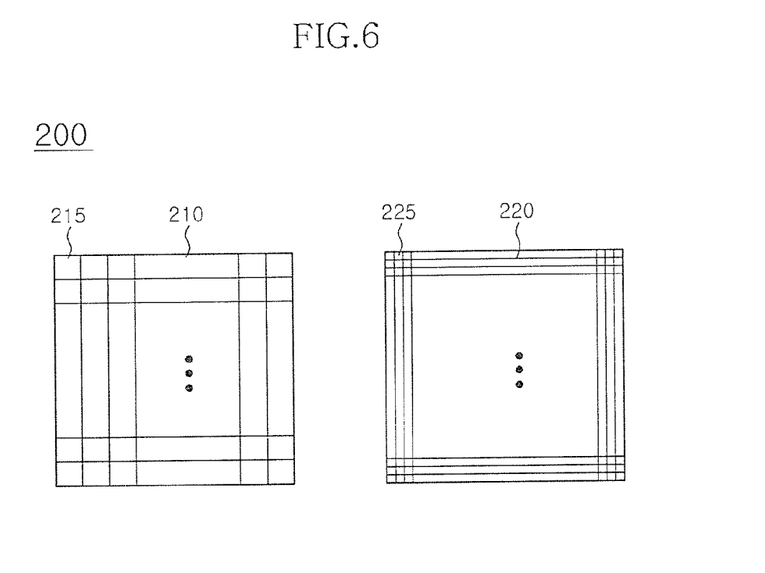
FIG. 6 is a plan view of a fusion memory device including a first and second phase change memory groups according to another example embodiment.
Figure 7:
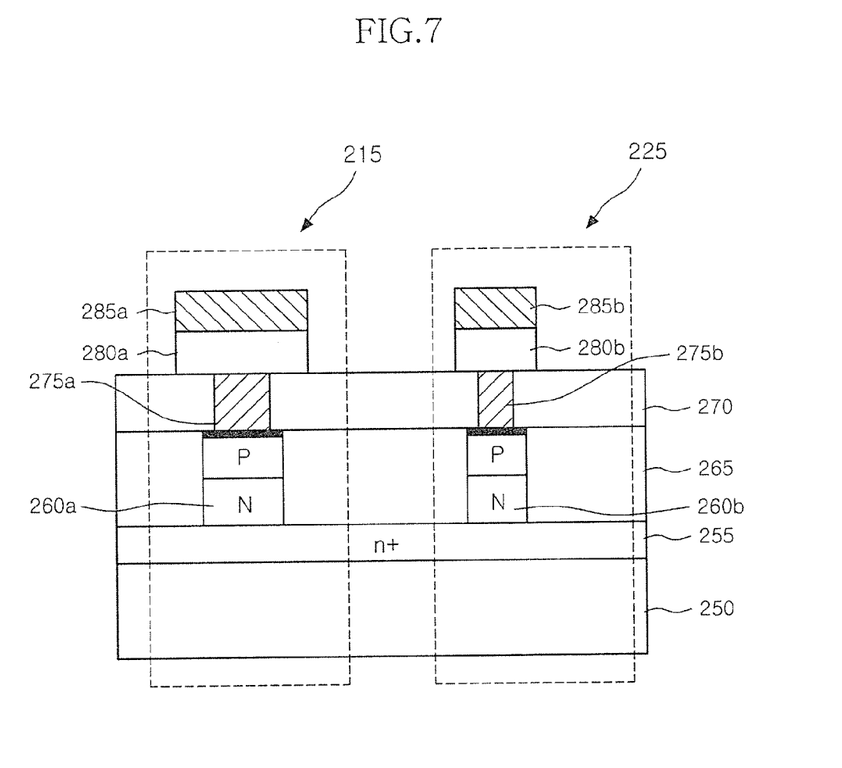
FIG. 7 is a sectional view of the first and second phase change memory groups of FIG. 6.

FIG. 6 is a plan view of a fusion memory device including first and second phase change memory groups according to another example embodiment. FIG. 7 is a stylized sectional view of the first and second phase change memory groups in FIG. 6. Referring to FIGS. 6 and 7, the fusion memory device 200 may comprise the first phase change memory group 210 and the second phase change memory group 220. Herein, for example, the fusion memory device 200 corresponding only to the data storage block 10 and the work memory block 30 in the data processing system 100 of FIG. 1 may be illustrated in FIGS. 6 and 7. The first phase change memory group 210 and the second phase change memory group 220 comprise a plurality of memory cells 215 and 225, respectively.

In the example embodiment, the second memory cells 225 of the second phase change memory group 220 are shown to be smaller than the first memory cells 215 of the first phase change memory group 210. As a result of this size difference, the first and second phase change memory groups 210 and 220 can be configured to exhibit slightly different phase change properties. Herein, the sizes of the memory cells 215 and 225 may be a factor including all dimensions of switching devices 260a and 260b, dimensions of heating electrodes 275a and 275b and dimensions of phase change material layers 280a and 280b. Therefore, the switching device 260b, the heating electrode 275b and the phase change material layer 280b constituting the second memory cell 225 in the second phase change memory group 220 may be smaller than those corresponding counter parts (260a, 275a and 280a) in the first memory cells 215 in the first phase change memory group 210. In particular, the phase change material layer 280b in the second phase change memory group 220 may also be sized smaller than the phase change material layer 280a of the first phase change memory group 210. Herein, the reference numeral 250 designates a semiconductor substrate, the reference numeral 255 indicates a junction word line region, the reference numerals 265 and 270 indicates interlayer insulating layers, the reference numeral 285a indicates an upper electrode of the first memory cell 215 and the reference numeral 285b indicates an upper electrode of the second memory cell 225.

In the embodiment where the second phase change memory group 220 having the memory cells 225 are smaller than the first memory cells 215 of the first phase change memory group 210, then writing data in the second phase change memory group 220 can be fast while using the same voltages.

Herein as mentioned above, the first phase change memory group 210 exhibits an inherent non-volatile property such that it may be used as a substitute for a flash memory device. The second phase change memory group 220 has the second phase change memory cells having a smaller size than the first phase change memory cells of the first phase change memory group 210 such that the second phase change memory group 220 can be used as a substitute for the DRAM due to the improved data processing speed as compared to the slower processing speeds needed with the first phase change memory group 210.

Furthermore, the phase change properties of the first and second phase change memory groups 210 and 220 can be varied by changing the structures of the phase change material layers constituting the first and second phase change memory groups 210 and 220.

Figure 8:
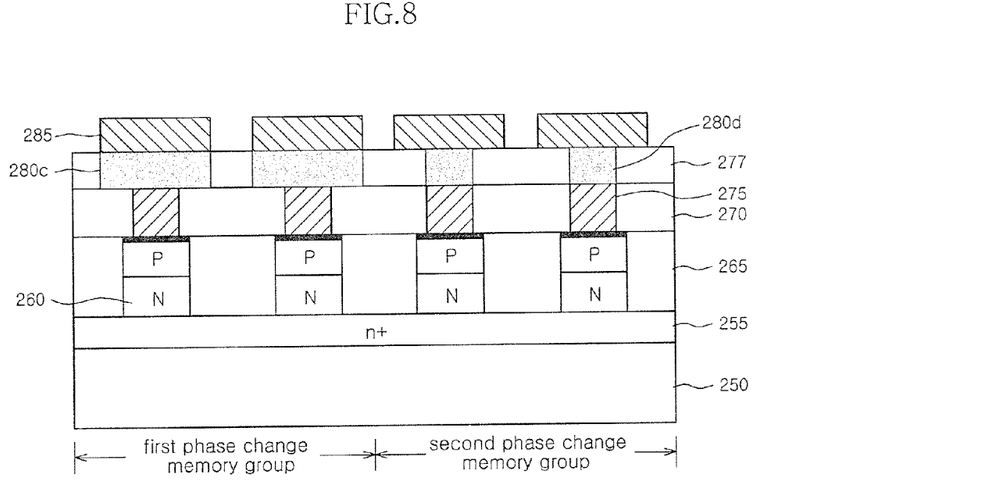
FIG. 8 is a sectional view of a first and second phase change memory groups according to another example embodiment.

That is, referring to FIG. 8, a phase change material layer 280c in the first phase change memory group 210 is formed on a heating electrode 275 which has a typically planar type. The phase change material layer 280c has a critical dimension (CD) larger than the heating electrode 275 and is configured to be formed as a pattern having substantially the same size as that of the upper electrode 285.

Meanwhile, a phase change material layer 280d of the second phase change material memory group 220 is configured to be formed on the heating electrode 275 as a buried type or a contact type. The phase change material layer 280d has a critical dimension similar to a diameter of the heating electrode 275. The upper electrode 285 is formed to have the same pattern as the upper electrode 285 of the first phase change memory group 210.

Since the second phase change memory group 220 having the buried type phase change material layer 280d has a narrower CD than the phase change material layer 280c in the first phase change memory group 210, its volume also relatively smaller. Therefore, when the same set or reset voltage is applied to the first and second phase change memory groups 210 and 220, the phase change in the second phase change memory group 220 is occurs more easily.

According to this, the second phase change memory group 220 can exhibit a faster data processing speed than that of the first phase change memory group 210. Therefore, the second phase change memory group 220 can be used as a substitute for a DRAM. Meanwhile, since the first change memory group 210 exhibits a relatively inherent non-volatile property then it can be used as a substitute for a flash memory device.

Figure 9:
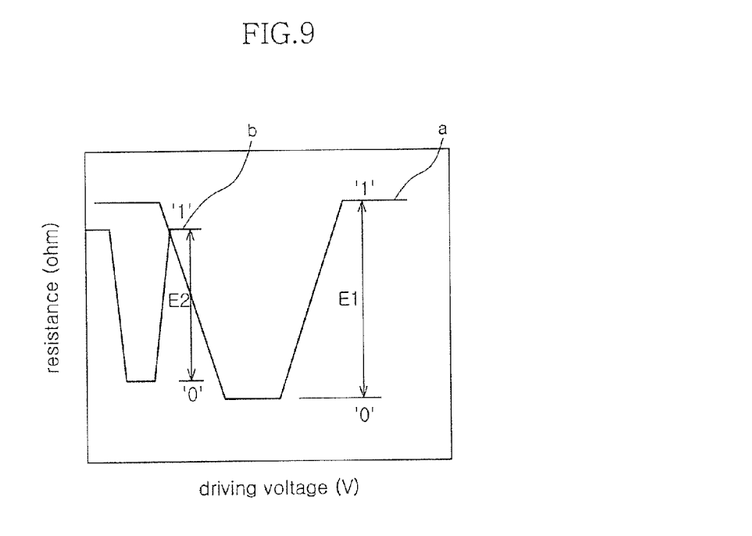
FIG. 9 is a graph showing an energy consumed in phase-change of the first and second phase change memory groups according to the example embodiment.

Referring to FIG. 9, suppose that that first and second phase change memory groups 210 and 220 have the same data processing speed. If a general driving voltage having a magnitude of "a" is pulsed to the first phase change memory group 210, and since the size of the memory cell 225 and/or the volume of the phase change material layer 280d in the second phase change memory group 220 are relatively smaller, the desired data processing speed can be obtained irregardless of application of the driving voltage "b" which is relatively lower than the driving voltage "a".

Accordingly, an amount E2 of energy consumption in the second phase change memory group 220 is lower than an amount E1 of energy consumption in the first phase change memory group 210 such that the second phase change memory group 220 can be used as a substitute for a DRAM which consumes less power.

Figure 10:
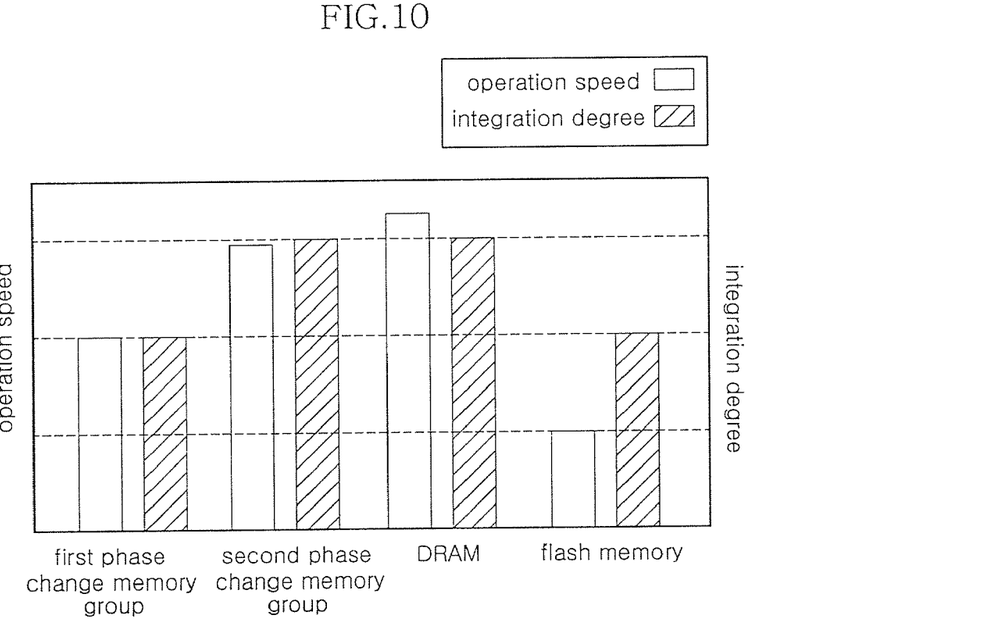
FIG. 10 is a graph showing a operation speed and an integration degree of the first and second phase change memory groups according to the example embodiment.

FIG. 10 is a result graph showing the operation speed and integration degree in the first and second phase change memory groups 210 and 220 according to the example embodiment. Referring to FIG. 10, the first phase change memory group 210 having a non-volatile property which is fabricated as the example embodiment that exhibits a considerably superior operation speed as compared with the flash memory device and exhibits an integration degree similar to that of the flash memory device.

Furthermore, the second phase change memory group 220 with compensated data processing property ensures the refresh and non-volatile property as well as it exhibits an operation speed that matches that of DRAMs and has an integration degree almost equal to that of DRAMs. As seen from the result graph, there is no problem that it substitutes the phase change memory devices for the DRAM and the flash memory device of the system in the operation speed and the integration.

Figure 11:
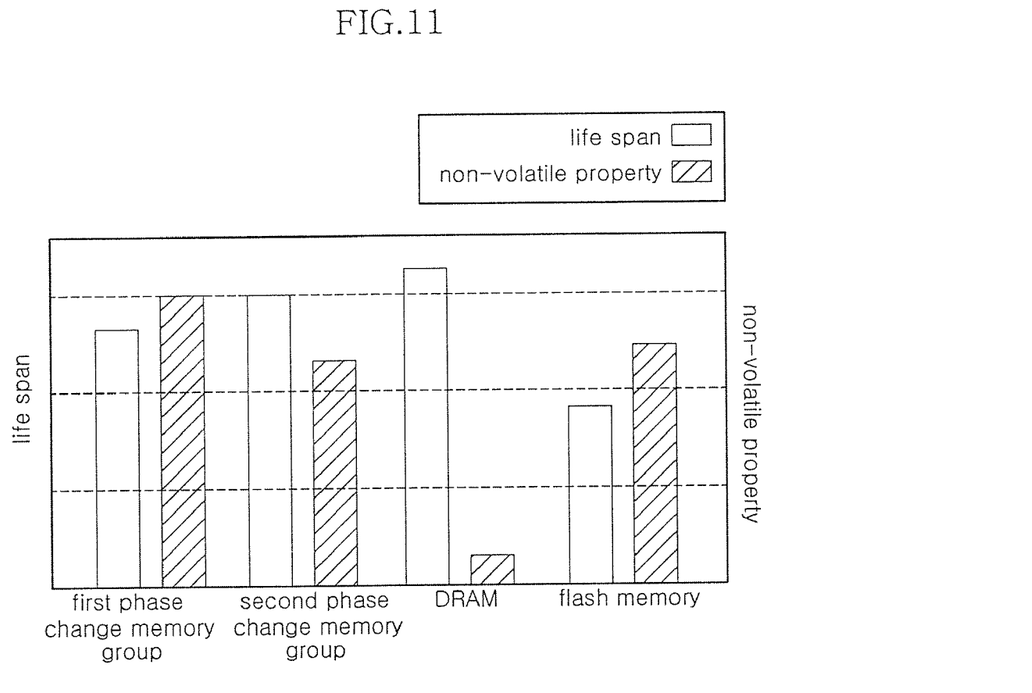
FIG. 11 is a graph showing a life span and a non-volatile property of the first and second phase change memory groups according to the example embodiment.

FIG. 11 is a result graph showing the life span and the non-volatile property in the first and second phase change memory groups 210 and 220 according to the example embodiment. Referring to FIG. 11, the first phase change memory group 210 with non-volatile property which is fabricated as the example embodiment exhibits a considerably superior life span as compared with the flash memory device and exhibits a non-volatile property that substantially matches that of flash memory devices.

Since the second phase change memory group 220 with compensated data processing property exhibits a superior non-volatile property as compared with the DRAM, then it also exhibits high data retention properties. The phase change memory group 220 also has a life span that is substantially almost equal to the DRAM. According to this, it is no problem to substitute the phase change memory devices for the DRAMs and for flash memory devices in the system.

Figure 12:
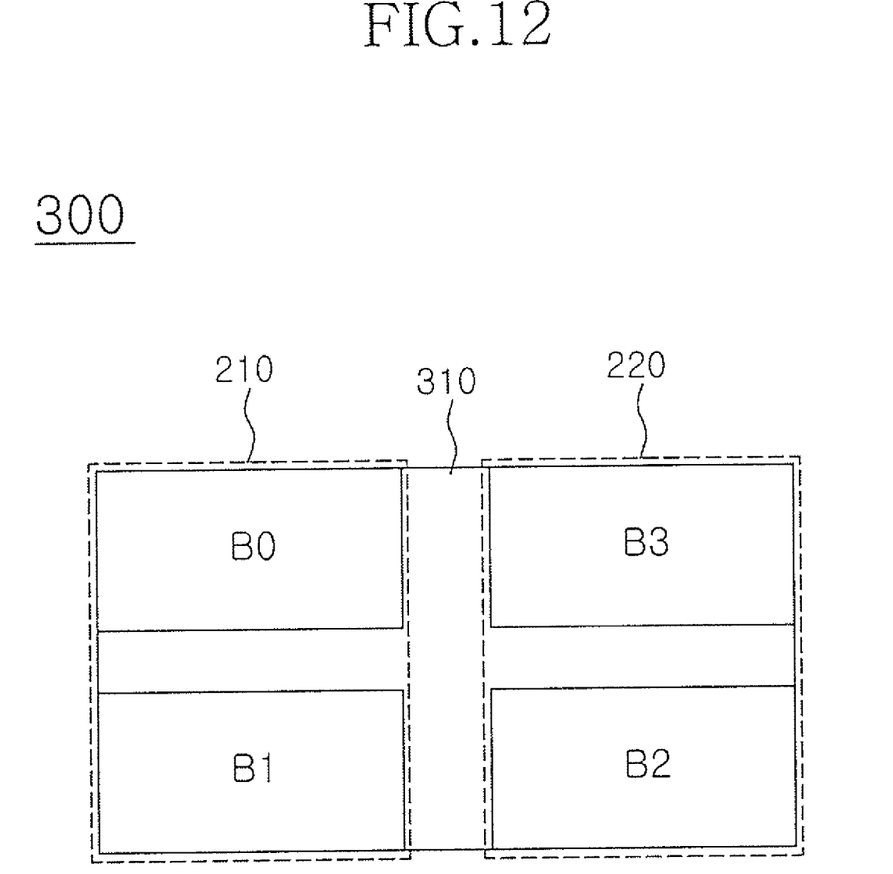
FIG. 12 is a diagram showing first and second phase change memory groups disposed on a semiconductor chip according to an example embodiment.

FIG. 12 is a diagram illustrating the first and second phase memory groups disposed on a semiconductor chip. Referring to FIG. 12, the fusion memory chip 300 includes a plurality of banks B0 to B3 and a peripheral region 310 arranged between the banks B0 to B3 similar to that of a conventional memory device. The peripheral region 310 includes a control circuit unit (not shown) for controlling the banks B0 through B3 such as a decoder and a sense amplifier and pads (not shown) for transferring external signals. It is understood herein that the banks B0 through B3 each represent an aggregation of a plurality of memory cells. In the example embodiment, the phase change memory devices that have different phase change properties may be disposed by the bank unit.

In the example embodiment, the first phase change memory groups 210 may be disposed in adjacent first and second banks B0 and B1 and the second phase change memory groups 220 may be disposed in adjacent memory banks B3 and B4. However, it is understood herein that this dispositional configuration it is not limited thereto. The first phase change memory groups 210 may be disposed in the first and third banks B0 and B2 and the second phase change memory groups 220 may be disposed into the second and fourth banks B1 and B3.

As described above, in the fusion memory device, the system units performing different functions comprises phase change memory devices which have random access property and non-volatile property and are capable of controlling the data processing speed by controlling the phase change property (resistance distribution).

According to this, one memory device can perform various functions such that separate driving circuits and additional fabrication processes for an integration on one semiconductor substrate are unnecessary, thereby improving the performance of the fusion memory device.

Furthermore, the phase change memory devices have operation speed, integration, life span and data retention time similar to that of the DRAM and flash memory devices. The phase change memory devices can solve the problem of the refresh property and long program time in the DRAM and the flash memory devices, thereby further improving the performance of the fusion memory device.

The inventive concept is not limited to the example embodiments. In the example embodiments, although the first and second phase change memory groups having different functions are fabricated by changing a program condition, a cell size and a structure of the phase change material layer, they may be fabricated by combining at least one or more of the change conditions.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A fusion memory device, comprising:
a chip;
a first phase change memory group having first phase change conditions on the chip; and
a second phase change memory group arranged on the chip with the first phase change memory group, the second phase change memory group having second phase change conditions being different from the first phase change conditions, wherein the first phase change memory group has a first sensing ratio and the second phase change memory group has a second sensing ratio smaller than the first sensing ratio.

2. The fusion memory device of claim 1, wherein the first phase change memory group is a substitute device for a flash memory device and the second phase change memory group is a substitute device for a dynamic random access memory.

3. The fusion memory device of claim 2, wherein the first phase change memory group is configured to write data corresponding to binary "0"s and "1"s by using a first set voltage and a first reset voltage which are pulsed for a first interval of between about 100 to 300 ns.

4. The fusion memory device of claim 3, wherein the second phase change memory group is configured to write data corresponding to binary "0"s and "1"s by using a second set voltage and a second reset voltage which are pulsed for a second interval which is less than the first interval, the second reset voltage having a voltage level lower than the first reset voltage.

5. The fusion memory device of claim 2, wherein the first phase change memory group comprises a first plurality of phase change memory cells which are programmed so that a phase change material layer in each of the first plurality of phase change memory cells is able to be substantially fully transitioned between each solid state phase.

6. The fusion memory device of claim 5, wherein the second phase change memory group comprises of a second plurality of phase change memory cells which are programmed so that a phase change material layer in each of the second plurality of phase change memory cells is able to be partially transitioned between each solid state phase.

7. The fuse memory device of claim 2, wherein each of the phase change memory cells in the second phase change memory group are smaller than each of the phase change memory cells in the first phase change memory group.

8. The fusion memory device of claim 7, wherein each of the plurality of phase change memory cells in the first and second phase change memory groups comprises a separate corresponding switching element, a separate corresponding heating electrode and a separate corresponding phase change material layer; and
wherein the phase change material layer of each of the phase change memory cells in the second phase change memory group is smaller than the phase change material layer of each of the phase change memory cells in the first phase change memory group.

9. The fusion memory device of claim 2, wherein each of the plurality of phase change memory cells in the first and second phase change memory groups comprises a separate corresponding heating electrode, a separate corresponding phase change material layer, and an separate corresponding upper electrode that are sequentially stacked together; and
wherein each phase change memory cells of the first phase change memory group, the separate corresponding phase change material layer and the separate corresponding upper electrode are configured to have substantially the same pattern size and configured to be larger than their respective separate corresponding heating electrode.

10. The fusion memory device of claim 9, wherein the separate corresponding phase change material layer in each of the phase change memory cells of the second phase change memory group has a contact shape which is substantially the same diameter as that of the respective separate corresponding heating electrode.

11. The fusion memory device of claim 10, wherein the separate corresponding upper electrode in each of the phase change memory cells of the second phase change memory group has a pattern shape which is substantially larger than the respective separate corresponding phase change material layer.

12. The fusion memory device of claim 1, wherein the fusion memory device comprises of a plurality of memory banks such that a first portion of the memory banks comprises the first phase change memory group and a remaining portion of the memory banks comprises the second phase charge memory group.

13. A fusion memory device, comprising:
   a first phase change memory group comprising a plurality of first phase change memory cells, each first phase change memory cell having a first set resistance and a first reset resistance; and
   a second phase change memory group integrated with the first phase change memory group on a single substrate, the second phase change memory group comprising a plurality of second phase change memory cells, each second phase change memory cell having a second set resistance and a second reset resistance,
   wherein the second reset resistance is smaller than the first reset resistance.

14. The fusion memory device of claim 13, wherein the first phase change memory group is configured to be reversibly transitioned between different solid state phases when subjected to a first set voltage and a first reset voltage; wherein the second phase change memory group is configured to be reversibly transitioned between different solid state phases when subjected to a second set voltage and a second reset voltage; and wherein the second reset voltage is less than the first reset voltage.

15. The fusion memory device of claim 14, wherein the second reset voltage has a voltage level between that of the first set and reset voltages.

16. The fusion memory device of claim 14, wherein a second pulsing time for driving phase changing operations in the second phase change memory group is shorter than a first pulsing time for driving phase changing operations in the first phase change memory group.

17. The fusion memory device of claim 13, wherein each of the second phase change memory cells are smaller than each of the first phase change memory cells.

18. The fusion memory device of claim 17, wherein a separate corresponding phase change layer in each second phase change memory cell is smaller than a separate corresponding phase change layer in each first phase change memory cell.

19. The fusion memory device of claim 13, wherein each of the first and second phase change memory cells includes a separate corresponding heating electrode, a separate corresponding phase change material layer coupled to the separate corresponding heating electrode, and a separate corresponding upper electrode arranged on the separate corresponding phase change material layer;
   wherein the phase change material layer and the upper electrode in each first phase change memory cell have substantially the same pattern shape;
   wherein the phase change material layer and the heating electrode in each second phase change memory cell are substantially the same contact shape, and the upper electrode in each second phase change memory cell is larger than the separate corresponding phase change material layer in that second phase change memory cell.

20. A system, comprising:
   a central processing unit (CPU);
   a data storage block configured to be controlled by the CPU, the data storage block including memory cell arrays and a page buffer; and
   a work memory block configured to be controlled by the CPU, the work memory block configured to perform an address mapping operation of the data storage block,
   wherein the data storage block comprises a first phase change memory group having a first set resistance and a first reset resistance;
   wherein the work memory block comprises a second phase change memory group having a second set resistance and a second reset resistance; and
   wherein the second reset resistance is smaller than the first reset resistance.

* * * * *